United States Patent
Hwang et al.

(10) Patent No.: US 6,847,202 B2
(45) Date of Patent: Jan. 25, 2005

(54) APPARATUS FOR RECOGNIZING WORKING POSITION OF DEVICE TRANSFER SYSTEM IN SEMICONDUCTOR DEVICE TEST HANDLER AND METHOD THEREOF

(75) Inventors: Hyun Joo Hwang, Kyonggi-do (KR); Seung Hwan Kim, Chungchongnam-do (KR)

(73) Assignee: Mirae Corporation, Choongchungnam-Do (KR)

( * ) Notice: Subject to any disclaimer, the term of this patent is extended or adjusted under 35 U.S.C. 154(b) by 0 days.

(21) Appl. No.: 10/316,047

(22) Filed: Dec. 11, 2002

(65) Prior Publication Data
US 2003/0128024 A1 Jul. 10, 2003

(30) Foreign Application Priority Data
Dec. 17, 2001 (KR) .................. 10-2001-0080155

(51) Int. Cl.$^7$ .................................................. G01R 1/04
(52) U.S. Cl. ..................................................... 324/158.1
(58) Field of Search .............................. 324/158.1, 754, 324/760; 414/403–409, 416; 209/571–574, 538; 356/614–617, 620–622

(56) References Cited

U.S. PATENT DOCUMENTS

| | | | | |
|---|---|---|---|---|
| 5,441,380 A | * | 8/1995 | Horikawa ................. 414/788.7 |
| 5,631,573 A | * | 5/1997 | Ohno ......................... 324/754 |
| 6,163,145 A | * | 12/2000 | Yamada et al. ............. 324/760 |
| 6,184,675 B1 | * | 2/2001 | Bannai ....................... 324/754 |
| 6,198,273 B1 | * | 3/2001 | Onishi et al. ............ 324/158.1 |
| 6,203,582 B1 | * | 3/2001 | Berner et al. ............... 414/941 |
| 6,259,247 B1 | * | 7/2001 | Bannai ....................... 324/754 |
| 6,293,408 B1 | * | 9/2001 | Behnke et al. ............. 209/540 |
| 6,515,470 B2 | * | 2/2003 | Suzuki et al. ............ 324/158.1 |
| 6,546,307 B1 | * | 4/2003 | Hsiao ......................... 700/121 |

* cited by examiner

*Primary Examiner*—Evan Pert
*Assistant Examiner*—Jermele Hollington
(74) *Attorney, Agent, or Firm*—Fleshner & Kim, LLP

(57) ABSTRACT

An apparatus and method is provided for recognizing a working position of a device transfer system in a semiconductor device test handler. The working position of a transfer unit of the handler is adjusted based on tray and change kit positions to allow components to be quickly and precisely loaded and transferred when various kinds of semiconductor devices are tested in the handler. A laser sensor which detects a color change of an object is provided with the transfer unit, and scans corners of the tray and change kits to acquire position information related to the tray and change kits. The working position of the transfer unit is calculated using basic handler information contained in the control unit of the handler and the acquired information.

25 Claims, 7 Drawing Sheets

APPARATUS FOR RECOGNIZING WORKING POSITION OF DEVICE TRANSFER SYSTEM IN SEMICONDUCTOR DEVICE TEST HANDLER AND METHOD THEREOF

This application claims the benefit of the Korean Application No. P2001-80155 filed on Dec. 17, 2001, which is hereby incorporated by reference.

BACKGROUND OF THE INVENTION

1. Field of the Invention

The present invention relates to an apparatus and method for recognizing a working position of a device transfer system in a semiconductor device test handler enabling to recognize to reset the working positions of the device transfer system for trays and change kits as replacing components fast and precisely when various kinds of semiconductor devices are tested in the handler.

2. Discussion of the Related Art

Generally, semiconductor devices produced in a production line undergo tests for checking whether to be good or fail before shipment.

A handler is a device for testing such semiconductor devices. The handler uses a semiconductor device transfer system to transfer semiconductor devices received on a tray to another process line automatically, loads the semiconductor devices on a test socket of a test site to carry out a demanded test thereon, and classifies the tested semiconductor devices into various levels to unload them on the tray. The handler carries out such steps repeatedly to perform the tests.

FIG. 1 illustrates a layout of a general handler for semiconductor device test.

Referring to FIG. 1, in a front part of a handler body 1, formed are a loading unit 2 on which trays receiving test-expecting semiconductor devices thereon are stacked and an unloading unit 3 having a plurality of trays receiving test-completed semiconductor devices classified into good products and fail products in accordance with test results. And, a soaking plate 7 is installed in rear of the loading unit 2. The soaking plate 7 includes a heating means (not shown in the drawing) and a cooling means (not shown in the drawing) inside to heat or cool the test-expecting semiconductor devices to a predetermined temperature for temperature test.

And, a reject multi-stacker 5, on which a plurality of trays are loaded to receive the semiconductor devices classified by grade into the fail products according to the test results, is installed in rear of the unloading unit 3.

In a test site 10 located at the foremost rear part of the handler body 1, a test socket 11 connected electrically to an external testing device is installed to test a performance of each of the semiconductor devices. Over the test sockets 11, formed are first and second index heads 12a and 12b installed to move horizontally to pick up to load the semiconductor devices, which are transferred to standby positions at both sides of the test sockets 11, on the test sockets 11 as well as to pick up to retransfer the tested semiconductor devices on the test sockets 11 to the standby positions at both sides.

In the very front of the test site 10, first and second shuttles 8a and 8b are installed to move back and forth. The first and second shuttles 8a and 8b receive to transfer the semiconductor devices from the loading unit 2 or the soaking plate 7 to the standby positions at both sides of the test sockets 11 of the test site 10. At one sides of the first and second shuttles 8a and 8b, third and fourth shuttles 9a and 9b are installed to move back and forth, respectively. The third and fourth shuttles 9a and 9b receive to transfer the test-completed semiconductor devices from the test site 10 to an outside of the test site 10.

Fixing frames 13 are installed at the front end of the handler body 1 and over the very front side of the test site 10 across the handler body 1, respectively. A pair of movable frames 14a and 14b are installed at the fixing frames 13 to move right and left along the fixing frames 13. And, two device transfer units 15 are installed at the movable frames 14a and 14b to move along the movable frames 14a and 14b to pick up semiconductor devices, respectively. Each of the device transfer units 15 includes a plurality of pickers (not shown in the drawing) to transport a plurality of the semiconductor devices simultaneously.

Meanwhile, a handler is constituted to carry out a test on such semiconductor devices as QFP, BGA, SOP, and the like. After one species of the semiconductor devices have been tested, another species of the semiconductor devices are tested. In such a case, a change kit including the tray, soaking plate 7, shuttles 8a, 8b, 9a, and 9c, test sockets 11, and the like is replaced by another change kit fitting to the semiconductor device species to carry out the test.

In this case, the change kits replaced according to the species of the test-expecting semiconductor devices differ from each other in pitches and sizes of landing units where the semiconductor devices land. Hence, working sections of the device transfer unit 15 should be reset. Namely, as options of the change kits are changed, positions, at which the device transfer unit 15 picks up the semiconductor devices, are varied. Hence, displacements of the device transfer unit 15 and pitches between the pickers (not shown in FIG. 1) of the device transfer unit 15, elevating heights of the pickers, and the like should be reset.

However, a worker checks the options of the change kits replaced by the above-explained manner one by one using a measurement jig and inputs the measurements to a control unit (not shown in the drawing) of the handler for programming, thereby setting a working position. In this case, a probability of error occurrence during input is high and a working position setup takes too much time. Hence, daily productivity is reduced and overall efficiency of the test work is decreased. Such problems become more serious when the number and species of the change kit for replacement increase.

SUMMARY OF THE INVENTION

Accordingly, the present invention is directed to an apparatus and method for recognizing a working position of a device transfer system in a semiconductor device test handler that substantially obviate one or more problems due to limitations and disadvantages of the related art.

An object of the present invention is to provide an apparatus and method for recognizing a working position of a device transfer system in a semiconductor device test handler enabling to recognize to reset the working position of the device transfer system for change kits including trays to be replaced as a species of test-expecting semiconductor devices is varied.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in an apparatus of recognizing the working position of a device transfer system for transferring semiconductor devices in handler, the apparatus comprising a laser sensor being horizontally movable and discharging a laser beam downward to a base plate on which one or more trays and change kits are provided and generating a corresponding output signals; a control unit determining locations of the trays and change kits with respect to the base plate upon receiving the output signal from the laser sensor; and a transfer unit moving toward the determined location for transferring semiconductors into or from the trays and change kits, wherein the laser sensor being rigidly fixed to one side of the transfer unit.

In another aspect of the present invention, in a method of recognizing a working position of a transfer unit using the above-described apparatus, the method comprises a first step of inputting a species of a test-expecting semiconductor device and a basic information of options of trays and change kits to the control unit; a second step of moving the transfer unit and the laser sensor to a position adjacent to one vertex of the tray and carrying out a scan of a laser sensor by moving the transfer unit in horizontal and vertical directions X and Y; a third step of getting a first position value P1y of a point meeting a corner of the tray while the laser sensor scans in the vertical direction Y and a second position value P2x of a point meeting a corner of the tray while the laser sensor scans in the horizontal direction X; a fourth step of moving the transfer unit and the laser senor to another position adjacent to another vertex of the tray in a diagonal direction and having the laser sensor scan in the horizontal and vertical directions X and Y; a fifth step of getting a third position value P3y of a point meeting a corner of the tray while the laser sensor scans in the vertical direction Y in the fourth step and a fourth position value P4x of a point meeting a corner of the tray while the laser sensor scans in the horizontal direction X in the fourth step; a sixth step of having the control unit calculate a coordinate of the transfer unit for centers of the semiconductor devices at a first row and column (1, 1) and a last row and column (n2, n1) of the tray and coordinates of horizontal and vertical pitches using the first to fourth position values and the basic information of the tray; a seventh step of carrying out the second to fifth steps selectively by moving the transfer unit to one of the change kits to get position values of the charge kits; and an eighth step of having the control unit calculate a coordinate of each of the change kits for centers of the semiconductor devices at a First row and column (1, 1) and a last row and column (n2, n1) of the corresponding change kit and coordinates of horizontal and vertical pitches using the position values found by the seventh step and the basic information of the change kits.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
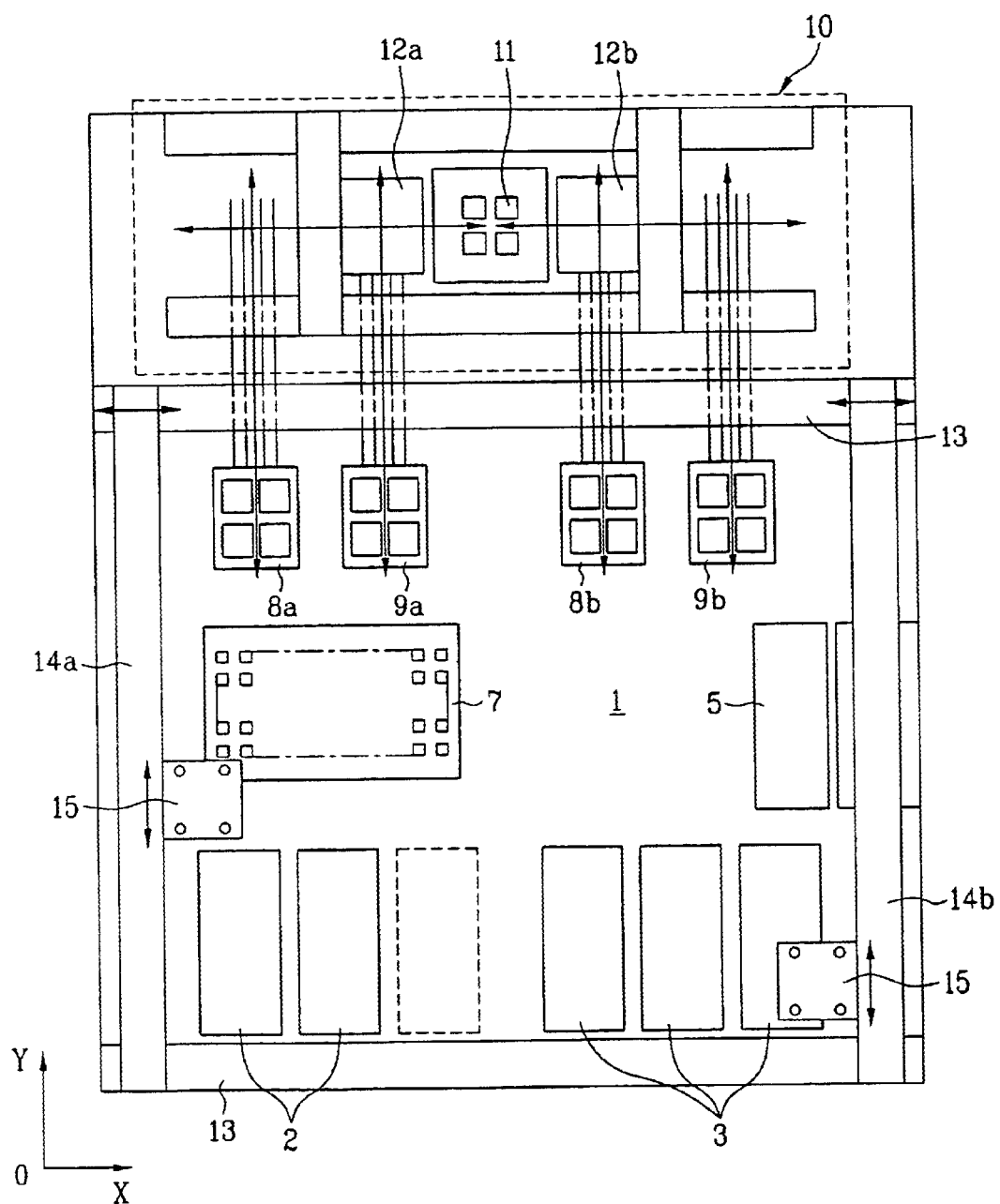
FIG. 1 illustrates a layout of a general handler for semiconductor device test.

For the convenience of understanding, a constitution of a handler, to which a method of recognizing a working position of a transfer unit according to the present invention, refers to that of the handler according to the related art in FIG. 1.

Figure 2:
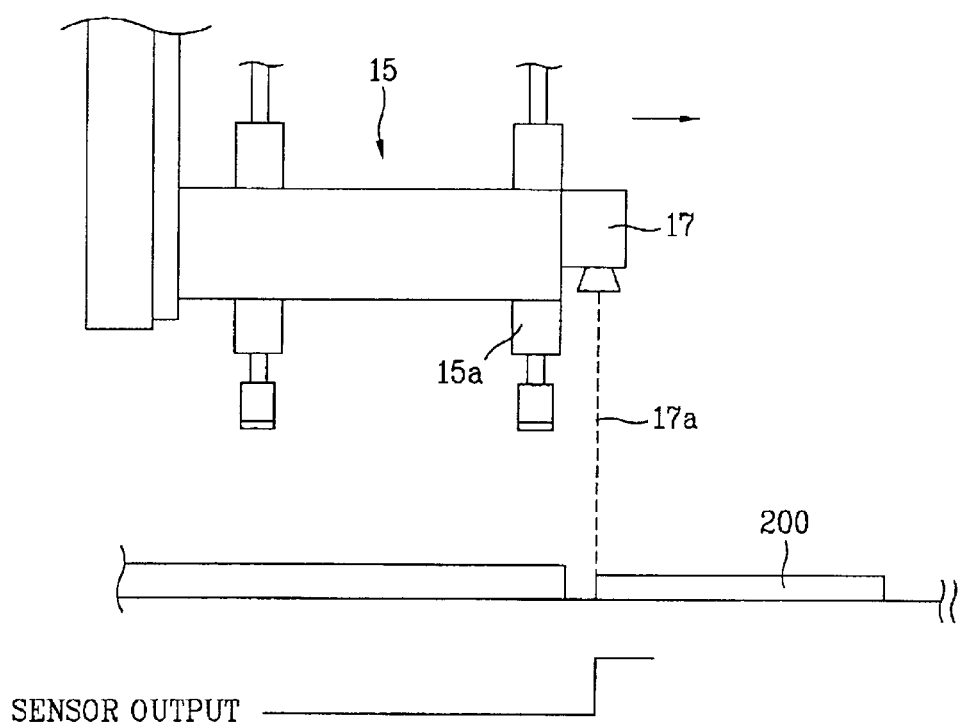
FIG. 2 illustrates a diagram for constitution and operation of an apparatus for recognizing a working position of a device transfer system in a handler according to one embodiment of the present invention.

FIG. 2 illustrates a diagram for constitution and operation of an apparatus for recognizing a working position of a device transfer system in a handler according to one embodiment of the present invention.

Referring to FIG. 2, a laser sensor 17, which irradiates a laser beam 17a downward and detects a color change of a detected object and send output signals to a controller unit (not shown), is fixedly installed in one side of a device transfer unit 15. The laser sensor 17 scans a handler body as the pickup device moves. If the laser beam 17a comes into contact with such a change kit having a color different that of base plate of the handler body as a tray 200, soaking plate 7, and shuttles 8a, 8b, 9a, and 9b, an output waveform is changed to make the laser sensor 17 detect an object.

Figure 3:
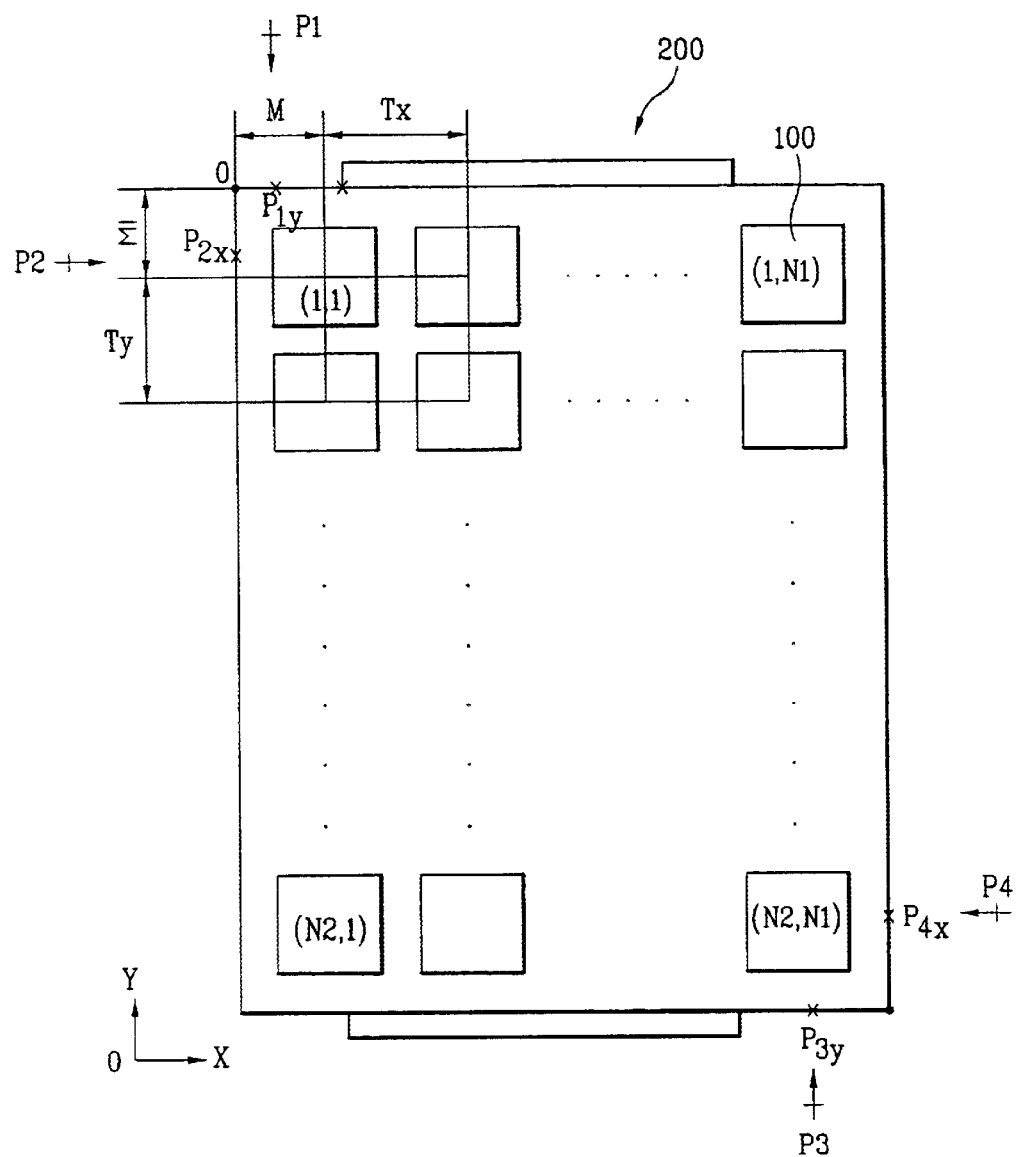
FIG. 3 illustrates a layout of a tray for explaining a method of recognizing a working position for a tray of a device transfer system in a handler according to the present invention.
Figure 4:
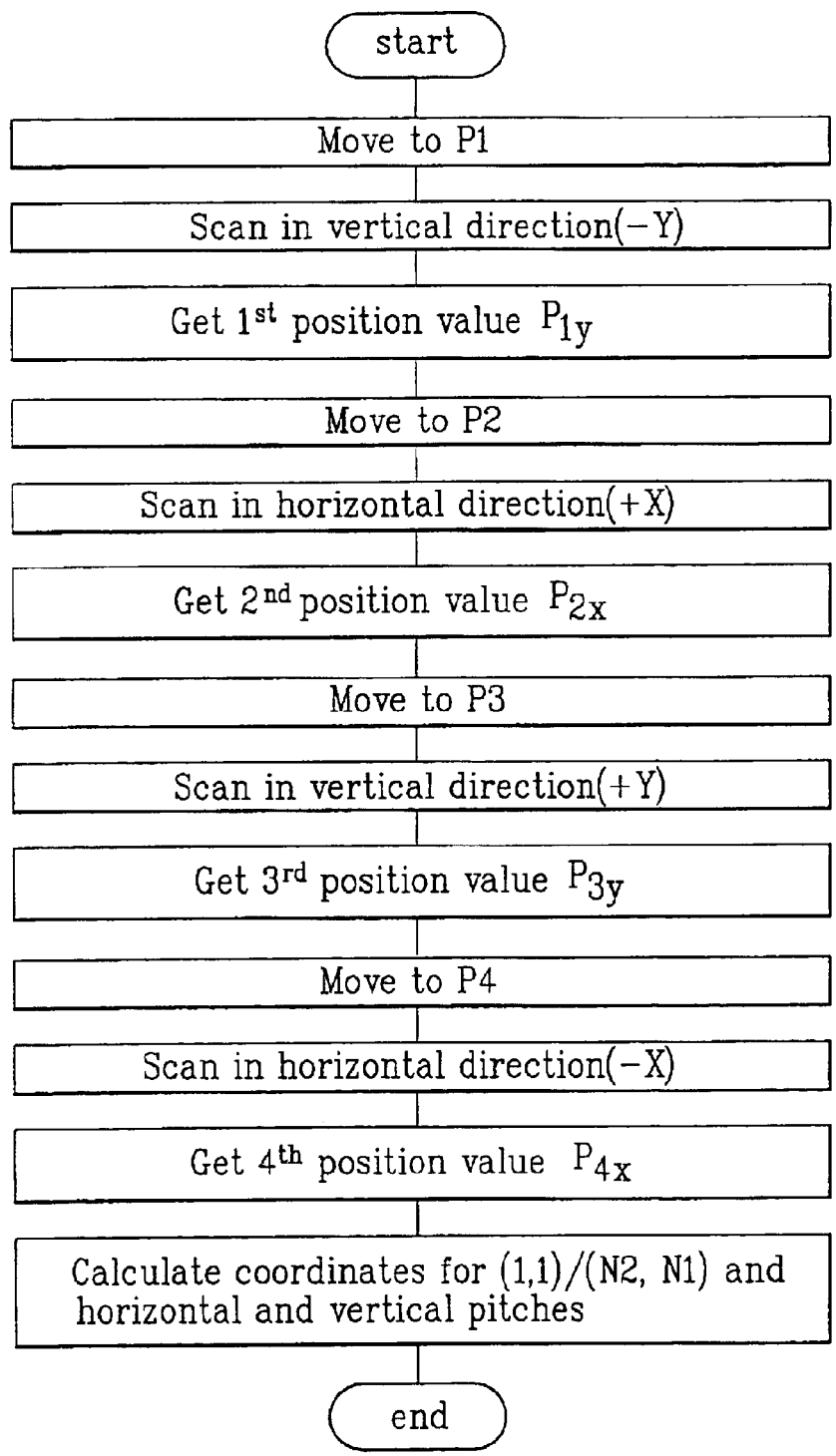
FIG. 4 illustrates a flowchart of a method of recognizing working position for a tray of a device transfer system in FIG. 3.
Figure 5:
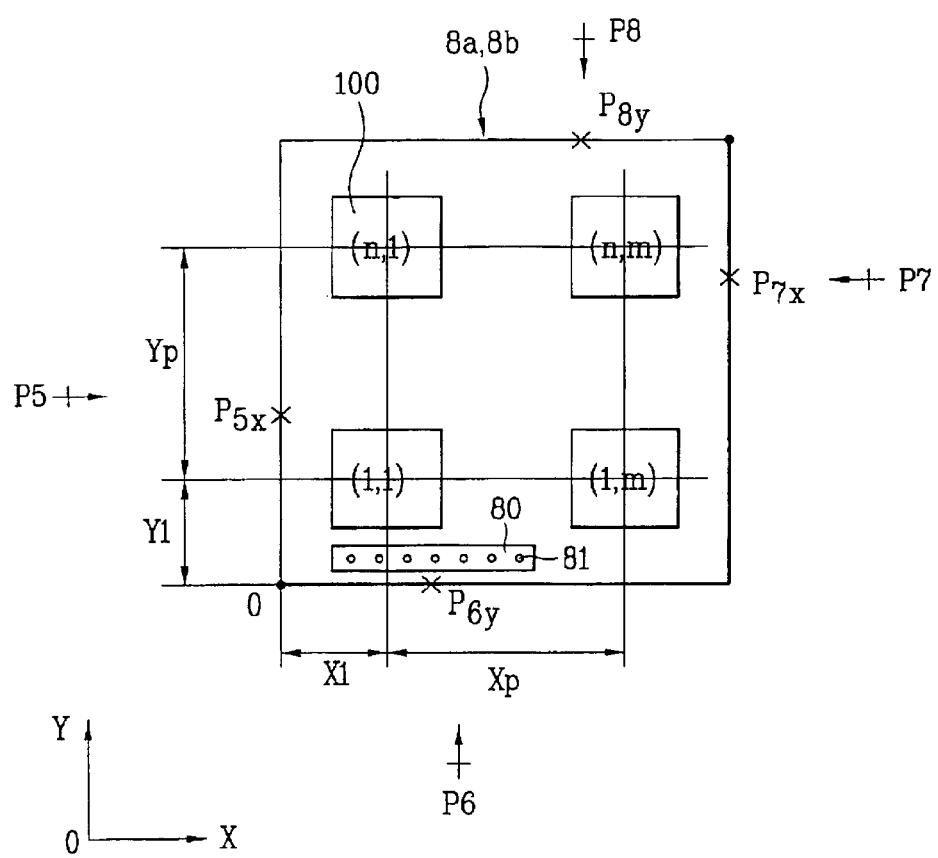
FIG. 5 illustrates a layout of a change kit for explaining a method of recognizing working position for a change kit of a device transfer system in a handler according to the present invention.
Figure 6:
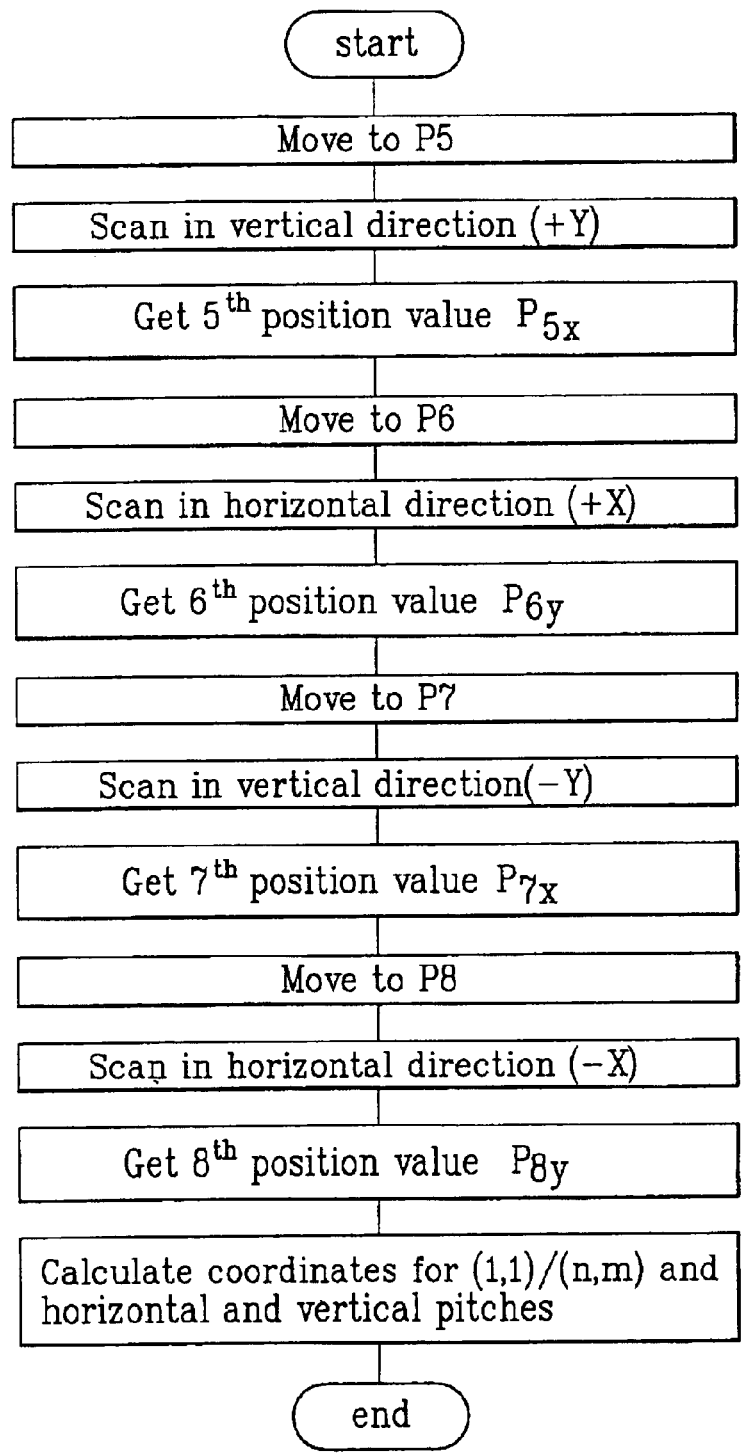
FIG. 6 illustrates a flowchart of a method of recognizing working position for a change kit of a device transfer system in FIG. 5.
Figure 7:
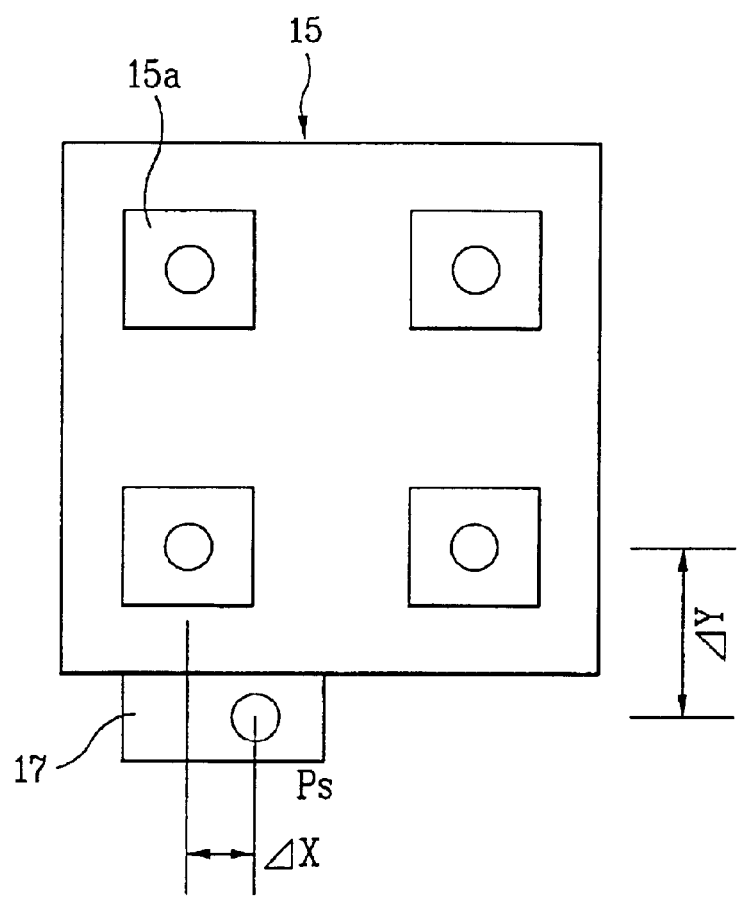
FIG. 7 illustrates a layout of a device transfer system for explaining an offset value between a picker of a device transfer system and an apparatus for recognizing a working position.

FIGS. 3 to 7 illustrate diagrams for explaining a method of recognizing a working position of the device transfer system according to the present invention. FIG. 3 illustrates a layout of a tray for explaining a method of recognizing a tray working position of a transfer unit in a handler according to the present invention, FIG. 4 illustrates a flowchart of a method of recognizing a working position of a tray in FIG. 3, FIG. 5 illustrates a layout of a change kit for explaining a method of recognizing a change kit working position of a transfer unit in a handler according to the present invention, FIG. 6 illustrates a flowchart of a method of recognizing a working position of a change kit in FIG. 5, and FIG. 7 illustrates a layout of a transfer unit for explaining an offset value between a picker of a transfer unit and an apparatus for recognizing a working position.

First of all, before a recognition operation of working positions of trays and change kits is carried out, species of test-expecting semiconductor devices and various kinds of basic informations of the tray and change kits are inputted to a control unit (not shown in the drawing). The informations of the tray 200 and change kits 7, 8a, 8b, 9a, and 9b, which are inputted to the control unit (not shown in the drawing) are basically provided by a manufacturer when the tray and change kits are manufactured. The informations includes sizes of the tray 200 and soaking plate 7, and shuttles 8a, 8b, 9a, and 9b, a horizontal distance (M1, X1) between an origin O and a center of a semiconductor device 100 adjacent to the origin O, a vertical distance (M2, Y1) between an origin O and a center of a semiconductor device 100 adjacent to the origin O, a horizontal pitch (Txp, Xp) between the semiconductor devices 100, a vertical pitch (Typ, Yp) between the semiconductor devices 100, a count of the semiconductor devices 100, and an offset compensating value ($\Delta X$, $\Delta Y$) (see FIG. 7) between a reference picker 15a of a transfer unit and a beam discharging point of the laser sensor 17.

After the basic informations has been inputted to the control unit of the handler, as shown in FIG. 3 and FIG. 4, the device transfer unit 15 is moved to a point P1 adjacent to one vertex as an origin of the tray 200. The device transfer unit 15 is then moved in a negative vertical direction –Y for scanning with the laser sensor 17.

If the laser beam of the laser sensor 17 comes into contact with a corner of the tray 200 while scanning, the laser sensor 17 transmits a signal of detecting the tray 200 to the control unit. The control unit then memorizes a first position value P1y as a coordinate of the pickup device at that point.

Subsequently, after the device transfer unit 15 has been moved to a point P2, a scan of the laser sensor 17 is carried out by moving the device transfer unit 15 in a positive horizontal direction +X to get a second position value P2x of one corner of the tray 200.

After the device transfer unit 15 has been moved to a point P3 adjacent to a diagonal vertex of the tray 200, a scan of the laser sensor 17 is carried out by moving the device transfer unit 15 in a positive vertical direction +Y to get a third position value P3y of a corner of the tray 200.

After the device transfer unit 15 has been moved to a point P4, a scan of the laser sensor 17 is carried out by moving the device transfer unit 15 in a negative horizontal direction –X to get a fourth position value P4x of a corner of the tray 200.

It is able to calculate primarily a coordinate of the device transfer unit 15 and coordinates of horizontal and vertical pitches against central points of the semiconductor devices on first row and column (1,1) and last row and column (N2, N1) of the tray 200 using the above-found first to fourth position values P1y, P2x, P3y, and P4x and the information inputted previously to the control unit such as a size of the tray, a count of the semiconductor devices 100 mounted on the tray, horizontal and vertical pitches Txp and Typ between the semiconductor devices 100, and a distance (M, M1) between the origin (O) and a center of the adjacent semiconductor device 100.

For instance, a coordinate of the center of the semiconductor device on the first row and column (1, 1) can be found by an equation of (1,1)±{(P2x+M), (P1y–M1)}.

Moreover, a horizontal pitch is (P4x-P2x-2)/(N1-1) and a vertical pitch is (P1y-P3y-2M1)/(N2-1).

Meanwhile, even if the device picking up the semiconductor device in the pickup device is practically the picker 15a, the coordinates are found by taking the laser beam 17a of the laser sensor 17 as a reference. Hence, in order for the device transfer unit 15 to pick up the semiconductor devices correctly for practical use, a distance difference between the reference picker 15a of the device transfer unit 15 and the laser beam 17a discharging point needs to be compensated for the coordinates.

Namely, the offset compensating value ($\Delta X$, $\Delta Y$) between the position of the reference picker 15a and the laser beam 17a discharging point of the laser sensor 17, as shown in FIG. 7, is calculated on the coordinate setup to reset a final coordinate.

Once the recognition operation of the working position for the tray 200 is completed, the device transfer unit 15 moves to the change kits such as the soaking plate 7 (see. FIG. 1) and the shuttles 8a and 8b in turn to carry out the recognition operations of working positions in a manner similar to the above-explained procedures.

Referring to FIG. 5 and FIG. 6, after the device transfer unit 15 has been moved to a point P5 adjacent to one side vertex of the shuttle 8a or 8b, the device transfer unit 15 is moved in the positive horizontal direction +X to carry out a scan of the laser sensor 17 to get a fifth position value P5x of a corner of the shuttle 8a or 8b. After the device transfer unit 15 has been moved to a point P6, the device transfer unit 15 scans in the positive vertical direction +Y to get a sixth position value P6y of a corner of the shuttle 8a or 8b.

After the device transfer unit 15 has been moved to a point P7 adjacent to a diagonal vertex of the shuttle 8a or 8b, the device transfer unit 15 scans in the negative horizontal direction –X to get a seventh position value P7x.

After the device transfer unit 15 has been moved to a point P8 adjacent to a diagonal vertex of the shuttle 8a or 8b, the device transfer unit 15 scans in the negative vertical direction –Y to get an eighth position value P8y.

It is able to calculate primarily a coordinate of the device transfer unit 15 and coordinates of horizontal and vertical pitches against central points of the semiconductor devices on first row and column (1,1) and last row and column (n, m) of the shuttle 8a or 8b using the above-found fifth to eighth position values P5x, P6y, P7x, and P8y and the information inputted previously to the control unit such as a size of the shuttle 8a or 8b, a count of the semiconductor devices 100 mounted on the shuttle 8a or 8b, horizontal and vertical pitches Txp and Typ between the semiconductor devices 100, a distance (M, M1) between the origin (O) and a center of the adjacent semiconductor device 100.

In this case, a coordinate of the center of the semiconductor device 100 on the first row and column (1,1) can be found by an equation of (1,1)={(P5x+X1), (P6y+Y1)}.

After the coordinate has been found primarily, the coordinates of the centers of the semiconductor devices at the first row and column (1,1) and the last row and column (n, m) are finally calculated to reset considering the offset compensating value ($\Delta X$, $\Delta Y$) shown in FIG. 7.

Meanwhile, after the operation of recognizing the working positions of the change kits has been carried out, or preferably, before the operation of recognizing the working positions of the change kits is carried out, the device transfer unit 15 carries out an operation of scanning a shuttle ID marks 80 installed at one side of the shuttle 8a or 8b in order to check whether the change kit is properly replaced to fit with the species of the test-expecting semiconductor devices.

The shuttle ID marks 80 attached to the first shuttle 8a or 8b includes a plurality of holes 81 arranged to leave a predetermined interval from each other. And, each of the holes is recognized as a binary code by the laser sensor 17 to represent the species of the change kit and semiconductor device.

Namely, when the laser sensor 17 scans the holes 81 of the shuttle ID marks 80, a portion having the hole 81 and another portion failing to have the hole 81 are recognized as '0' and '1', respectively to be transferred to the control unit. The control unit then recognizes the chance kit recognizing unit 80 by the binary codes transferred by the laser sensor 17.

For instance, Table 1 shows a construction of the change kit recognizing unit and Table 2 illustrates an exemplary construction of the recognizing unit of the shuttle 8a or 8b for testing 14×20 TQFP type semiconductor devices and a shuttle information inputted to the control unit based on Table 1. The first two digits of the binary code represented by the holes 81 of the recognizing unit 80, as shown in Table 1 and Table 2, indicates the species of the change kit, while the following eight digits represent the species of the test-expecting semiconductor device.

TABLE 1

| Change kit species | Semiconductor device species |
|---|---|
| 2 bits | 8 bits |
| 00: Soaking plate | 00000000: 14x20 TQFP |
| 01: shuttle | 10000000: 25x25 BGA |

TABLE 2

| Change kit recognizing unit | X1 | Y1 | Xp | Yp | n | M |
|---|---|---|---|---|---|---|
| | 30 | 30 | 80 | 80 | 2 | 2 |

Meanwhile, in the above-explained embodiments, the position values of the two points in diagonal directions of the tray and change kit are found to recognize the coordinates again. Yet, the position value of the tray or change kit can be found by selecting a random portion of four vertexes by the demand of an operator.

For instance, the tray and change kit may have measurement errors in their manufacturing processes. Besides, when being installed in the handler body, the tray and change kit may fail to fit the positions by the interference with the driving device to be inclined slightly. In order to carry out the recognition operation more precisely and decrease the probability of error occurrence, the position values of the entire four vertexes are preferably found to re-recognize the coordinates. It is a matter of course that this case needs a more time to recognize the working positions.

Accordingly, the present invention sets the working position of the transfer unit for the tray and change kit replaced by the simple construction automatically and promptly, thereby enabling to improve work efficiency as well as test productivity.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An apparatus for recognizing a working position of a device transfer system for transferring semiconductor devices in a handler, comprising:
   a laser sensor configured to discharge a laser beam downward onto a base plate on which at least one of a tray and change kit are provided, and to output at least one signal corresponding to the location associated with the at least one of the tray and the change kit;
   a control unit configured to receive the at least one signal from the laser sensor and to determine a location of the at least one of the tray and the change kit with respect to the base plate based on the at least one signal output by the laser sensor; and
   a transfer unit configured to move toward the location determined for the at least one of the tray and the change kit, and to transfer the semiconductor device onto and remove the semiconductor devices from the at least one of the tray and the change kit, wherein the laser sensor is configured to be fixed to one side of the transfer unit.

2. A method for recognizing a working position of the device transfer system in a semiconductor device test handler using the apparatus according to claim 1, the method comprising:
   a first step of inputting a species of a test-expecting semiconductor device and a basic information of options of trays and change kits to the control unit;
   a second step of moving the transfer unit and the laser sensor to a position adjacent to one vertex of the tray and carrying out a scan of a laser sensor by moving the transfer unit in horizontal and vertical directions X and Y;
   a third step of getting a first position value P1y of a point meeting a corner of the tray while the laser sensor scans in the vertical direction Y and a second position value P2x of a point meeting a corner of the tray while the laser sensor scans in the horizontal direction X;
   a fourth step of moving the transfer unit and the laser sensor to another position adjacent to another vertex of the tray in a diagonal direction and having the laser sensor scan in the horizontal and vertical directions X and Y;
   a fifth step of getting a third position value P3y of a point meeting a corner of the tray while the laser sensor scans in the vertical direction Y in the fourth step and a fourth position value P4x of a point meeting a corner of the tray while the laser sensor scans in the horizontal direction X in the fourth step;
   a sixth step of having the control unit calculate a coordinate of the transfer unit for centers of the semiconductor devices at a first row and column (1,1) and a last row and column (n2, n1) of the tray and coordinates of horizontal and vertical pitches using the first to fourth position values and the basic information of the tray;
   a seventh step of carrying out the second to fifth steps selectively by moving the transfer unit to one of the change kits to get position values of the change kits; and
   an eighth step of having the control unit calculate a coordinate of each of the change kits for centers of the semiconductor devices at a first row and column (1,1) and a last row and column (n2, n1) of the corresponding change kit and coordinates of horizontal and vertical pitches using the position values found by the seventh step and the basic information of the change kits.

3. The method according to claim 2, wherein the transfer unit gets the position values of the corners adjacent to the entire vertexes of the tray and the change kits and the control unit gets the position values for the centers of the semiconductor devices at the respective vertexes of the change kits using the position values found by the transfer unit and the basic information of the change kits.

4. The method according to claim 2, wherein the basic information of the tray and change kits includes sizes of the tray and change kits, horizontal and vertical distances (M, X1) and (M1, Y1) between an origin O and a center of a first semiconductor device, horizontal and vertical pitches (Txp, Xp) and (Typ, Yp) between the semiconductor devices, a count of the semiconductor devices, and an offset compensating value ($\Delta X$, $\Delta Y$) between a reference picker of the transfer unit and a beam discharging point of the laser sensor.

5. The method according to claim 2, wherein, before or after the position values of the change kits are calculated, the transfer unit scans an upper surface of the change kit at one side to detect a change kit recognizing unit formed on the upper surface of the change kit to check whether a species of change kit coincides with the change kit for the test-expecting semiconductor devices.

6. The method according to claim 5, wherein the change kit recognizing unit comprises a plurality of holes arranged to leave a predetermined interval from each other to represent the species of the change kit and the corresponding semiconductor device as a binary expression, the laser sensor recognizes '0' or '1' if the hole of the recognizing unit is detected and '1' or '0' if the hole of the recognizing unit is not detected to transfer the recognized binary expression to the control unit, and the control unit then recognizes the change kit recognizing unit by binary codes transferred by the laser sensor.

7. An apparatus for recognizing a working position of a device transfer system in a handler, comprising:
a detecting device configured to detect a location associated with at least one of a tray and a change kit provided on a base plate of the handler, and to output at least one corresponding signal;
a control unit configured to receive the at least one corresponding signal output by the detecting device, and to determine the location of the at least one of the tray and the change kit based on the at least one corresponding signal; and
a transfer unit configured to move toward the location of the at least one of the tray and the change kit, and to transfer semiconductor devices to and remove semiconductor devices from the at least one of the tray and the change kit.

8. The apparatus of claim 7, wherein the detecting device comprises a laser sensor fixed to a side of the transfer unit and configured to discharge a laser beam downward onto the base plate.

9. The apparatus of claim 8, wherein the laser sensor is configured to detect the location of the at least one of the tray and the change kit based on a color of the tray, a color of the change kit, and a color of the base plate.

10. The apparatus of claim 8, further comprising a change kit recognizing unit provided on an upper surface of the change kit and configured to identify a species of the change kit.

11. The apparatus of claim 10, wherein the change kit recognizing unit comprises a plurality of holes arranged at predetermined intervals, wherein the plurality of holes and the predetermined intervals are configured to represent a binary expression configured to be recognized by the laser sensor.

12. The apparatus of claim 8, wherein the laser sensor is configured to move in a horizontal direction with respect to the base plate through a movement of the transfer unit, and wherein the at least one signal output by the laser sensor comprises four position values associated with the location of the tray.

13. A method for recognizing a working position of a device transfer system in a semiconductor device handler with a laser sensor mounted on a transfer unit, and at least one tray and at least one change kit provided on a base plate of the handler, the method comprising:
inputting species information for a plurality of devices to be tested, and inputting initial information on the at least one tray and at least one change kit;
moving the laser sensor mounted on the transfer unit to a position adjacent to a first vertex of the at least one tray, and conducting a laser scan of an area including the first vertex;
determining a first position value P1$y$ based on a vertical scan of the first vertex;
determining a second position value P2$x$ based on a horizontal scan of the first vertex;
moving the laser sensor mounted on the transfer unit to a position adjacent to a second vertex of the at least one tray, and conducting a laser scan of an area including the first vertex;
determining a third position value P3$y$ based on a vertical scan of the second vertex;
determining a fourth position value P4$x$ based on a horizontal scan of the second vertex;
calculating a position coordinate of the transfer unit for semiconductor devices positioned at a first row and column of the at least one tray, and at a last row and column of the at least one tray, and horizontal and vertical pitches based on the first, second, third, and fourth position values and the initial information input on the at least one tray;
moving the transfer unit to each of the at least one change kits and carrying out the moving, determining, and calculating steps for each of the at least one change kits to determine position values for the at least one change kit; and
calculating a position coordinate of the transfer unit for semiconductor devices positioned at a first row and column of the at least change kit, and at a last row and column of the at least one change kit, and horizontal and vertical pitches based on the position values determined for the at least one change kit and the initial information input on the at least one change kit.

14. The method of claim 13, wherein the second vertex is in a position diagonal to the first vertex.

15. The method of claim 13, inputting initial information on the at least one tray and the at least one change kit comprises inputting sizes of the at least one tray and the at least one change kit, horizontal distances between a predetermined origin and a center of a first semiconductor device, horizontal and vertical pitches between adjacent semiconductor devices, a quantity of semiconductor devices, and a reference value based on a distance between a picker of the transfer unit and a beam discharging point of the laser sensor.

16. The method of claim 13, further comprising scanning an upper surface of the at least one change kit and detecting a change kit recognizing unit formed on the upper surface of the at least one change kit and configured to identify a species of the at least one change kit.

17. The method of claim 16, wherein the upper surface of the at least one change kit is scanned before the position values of the at least one change kit is determined.

18. The method of claim 16, wherein the upper surface of the at least one change kit is scanned after the position values of the at least one change kit is determined.

19. The method of claim 16, further comprising comparing a pattern formed by the change kit recognizing unit to the species information and determining whether the species of at least one change kit corresponds to the species information.

20. The method of claim 19, wherein comparing a pattern formed by the change kit recognizing unit further comprises scanning a plurality of holes arranged at predetermined intervals along the change kit recognizing unit, converting the plurality of holes and predetermined intervals into a binary expression, and comparing the binary expression to the species information.

21. A method for recognizing a working position of a device transfer system in a semiconductor device handler with a laser sensor mounted on a transfer unit, and at least one of a tray and a change kit provided on a base plate of the handler, the method comprising:

inputting initial information for the at least one of a tray and a change kit;

determining positional information for the at least one of a tray and a change kit based on at least one color sensed by the laser sensor; and calculating a position coordinate of the transfer unit based on the positional information of the at least one of a tray and a change kit.

22. The method of claim 21, wherein determining positional information for the at least one of a tray and a change kit based on at least one color sensed by the laser sensor further comprises:

determining a first position value based on a vertical scan of a first vertex of the at least one of a tray and a change kit;

determining a second position value based on a horizontal scan of the first vertex of the at least one of a tray and a change kit;

determining a third position value based on a vertical scan of a second vertex of the at least one of a tray and a change kit; and determining a fourth position value based on a horizontal scan of the second vertex of the at least one of a tray and a change kit.

23. The method of claim 22, wherein the second vertex is in a position diagonal to the first vertex.

24. The method of claim 21, further comprising scanning an upper surface of at least one change kit, and detecting a change kit recognizing unit formed on the upper surface of the at least one change kit and configured to identify a species of the at least one change kit.

25. The method of claim 24, further comprising comparing a pattern formed by the change kit recognizing unit to the initial information and determining whether a detected species of the at least one change kit corresponds to the initial information.

* * * * *